United States Patent
Fan

(10) Patent No.: US 12,224,741 B2
(45) Date of Patent: Feb. 11, 2025

(54) CONTROL CIRCUIT WITH BIAS CIRCUITRY FOR A SEMICONDUCTOR MEMORY

(71) Applicant: CHANGXIN MEMORY TECHNOLOGIES, INC., Hefei (CN)

(72) Inventor: Yupeng Fan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 177 days.

(21) Appl. No.: 17/935,811

(22) Filed: Sep. 27, 2022

(65) Prior Publication Data
US 2023/0025992 A1    Jan. 26, 2023

Related U.S. Application Data

(63) Continuation of application No. PCT/CN2022/087731, filed on Apr. 19, 2022.

(30) Foreign Application Priority Data

Mar. 25, 2022 (CN) .......................... 202210306176.4

(51) Int. Cl.
H03K 17/687    (2006.01)
G11C 11/4074    (2006.01)
H03K 19/20    (2006.01)

(52) U.S. Cl.
CPC ...... H03K 17/6871 (2013.01); G11C 11/4074 (2013.01); H03K 19/20 (2013.01)

(58) Field of Classification Search
CPC . G11C 2207/2227; G11C 5/148; G11C 7/109; G11C 7/222; G11C 7/225;
(Continued)

(56) References Cited

U.S. PATENT DOCUMENTS 5,399,992 A    3/1995    Itakura
6,239,649 B1    5/2001    Bertin
(Continued)

FOREIGN PATENT DOCUMENTS

| CN | 1585271 A | 2/2005 |
|----|-----------|--------|
| CN | 1741190 A | 3/2006 |

(Continued)

OTHER PUBLICATIONS

First Office Action of the Taiwanese application No. 111137531, issued on Aug. 30, 2023. 6 pages with English abstract.
(Continued)

*Primary Examiner* — Sultana Begum
(74) *Attorney, Agent, or Firm* — Syncoda LLC; Feng Ma

(57) ABSTRACT

A control circuit includes a bias circuit. The bias circuit is configured to provide a bias current for a functional circuit. The bias circuit includes a first bias circuit and a second bias circuit. The first bias circuit is configured to provide a first bias current, and the second bias circuit is configured to provide a second bias current. Herein, the first bias current is smaller than the second bias current, the first bias circuit is configured to be in a normally open state after being powered on, and the second bias circuit is configured to receive a bias enabling signal and provide the second bias current based on the bias enabling signal.

17 Claims, 9 Drawing Sheets

(58) Field of Classification Search
CPC ......... G11C 8/06; G11C 11/34; G11C 11/401; G11C 11/4072; G11C 11/4076; G11C 11/4082; G11C 11/4093; G11C 11/4074; G06F 1/3203; Y02D 10/00; H03K 17/6871; H03K 19/20
See application file for complete search history.

(56) References Cited

U.S. PATENT DOCUMENTS

| | | | |
|---|---|---|---|
| 6,294,404 | B1 | 9/2001 | Sato |
| 7,639,097 | B2 | 12/2009 | Tran |
| 8,559,245 | B2 * | 10/2013 | Kang .................... G11C 5/147 |
| | | | 365/189.11 |
| RE47,832 | E | 1/2020 | Ruotsalainen |
| 10,691,150 | B1 | 6/2020 | Delshadpour |
| 2005/0047247 | A1 | 3/2005 | Hatakeyama |
| 2007/0024344 | A1 | 2/2007 | Hatakeyama |
| 2009/0147594 | A1 | 6/2009 | Chou |
| 2010/0134182 | A1 | 6/2010 | Kapoor |
| 2016/0308512 | A1 | 10/2016 | Ruotsalainen |
| 2019/0035434 | A1 | 1/2019 | Tanaka et al. |
| 2019/0065106 | A1 | 2/2019 | Howe |
| 2019/0180794 | A1 | 6/2019 | Tanaka et al. |
| 2019/0287576 | A1 | 9/2019 | Tanaka et al. |
| 2020/0081476 | A1 | 3/2020 | Lallement et al. |
| 2021/0394339 | A1 | 12/2021 | Howe |
| 2022/0004213 | A1 | 1/2022 | Zhou |

FOREIGN PATENT DOCUMENTS

| | | |
|---|---|---|
| CN | 101443916 A | 5/2009 |
| CN | 106257580 A | 12/2016 |
| CN | 110868201 A | 3/2020 |
| CN | 110890886 A | 3/2020 |
| CN | 111416613 A | 7/2020 |
| CN | 112398466 A | 2/2021 |
| CN | 113364442 A | 9/2021 |
| KR | 20140007464 A | 1/2014 |
| TW | I719848 B | 2/2021 |

OTHER PUBLICATIONS

Supplementary European Search Report in the European application No. 22789451.6, mailed on Nov. 17, 2023. 8 pages.

International Search Report in the international application No. PCT/CN2022/087731, mailed on Dec. 21, 2022. 6 pages with English translation.

KR office action in application No. 10-2022-7035487, mailed on Jun. 27, 2024.

* cited by examiner

CONTROL CIRCUIT WITH BIAS CIRCUITRY FOR A SEMICONDUCTOR MEMORY

CROSS-REFERENCE TO RELATED APPLICATIONS

This is a continuation of International Patent Application No. PCT/CN2022/087731 filed on Apr. 19, 2022, which claims priority to Chinese Patent Application No. 202210306176.4 filed on Mar. 25, 2022. The disclosures of the above-referenced applications are hereby incorporated by reference in their entirety.

BACKGROUND

With the continuous development of semiconductor technology, the speed of data transmission is increasingly demanded when devices such as computers are manufactured and used. In order to achieve a faster data transmission speed, a series of devices such as memory in which data can be transmitted at Double Data Rate (DDR) have been developed.

In Dynamic Random Access Memory (DRAM), in order to save power, both an input buffer circuit and a bias circuit need to be powered down when the memory enters a Power Down State.

SUMMARY

The disclosure relates to the technical field of semiconductors, in particular to a control circuit and a semiconductor memory circuit.

According to a first aspect of the present disclosure, there is provided a control circuit. The control circuit includes a bias circuit. The bias circuit is configured to provide a bias current for a functional circuit. The bias circuit includes a first bias circuit and a second bias circuit. The first bias circuit is configured to provide a first bias current, and the second bias circuit is configured to provide a second bias current. Herein, the first bias current is smaller than the second bias current, the first bias circuit is configured to be in a normally open state after being powered on, and the second bias circuit is configured to receive a bias enabling signal and provide the second bias current based on the bias enabling signal.

According to a second aspect of the disclosure, there is provided a semiconductor memory, which may include a control circuit as in the first aspect.

The embodiments of the present disclosure provide a control circuit and a semiconductor memory. The control circuit includes a bias circuit. The bias circuit is configured to provide a bias current for a functional circuit. The bias circuit includes a first bias circuit and a second bias circuit. The first bias circuit is configured to provide a first bias current, and the second bias circuit is configured to provide a second bias current. Herein, the first bias current is smaller than the second bias current, the first bias circuit is configured to be in a normally open state after being powered on, and the second bias circuit is configured to receive a bias enabling signal and provide the second bias current based on the bias enabling signal.

DETAILED DESCRIPTION

Figure 1:
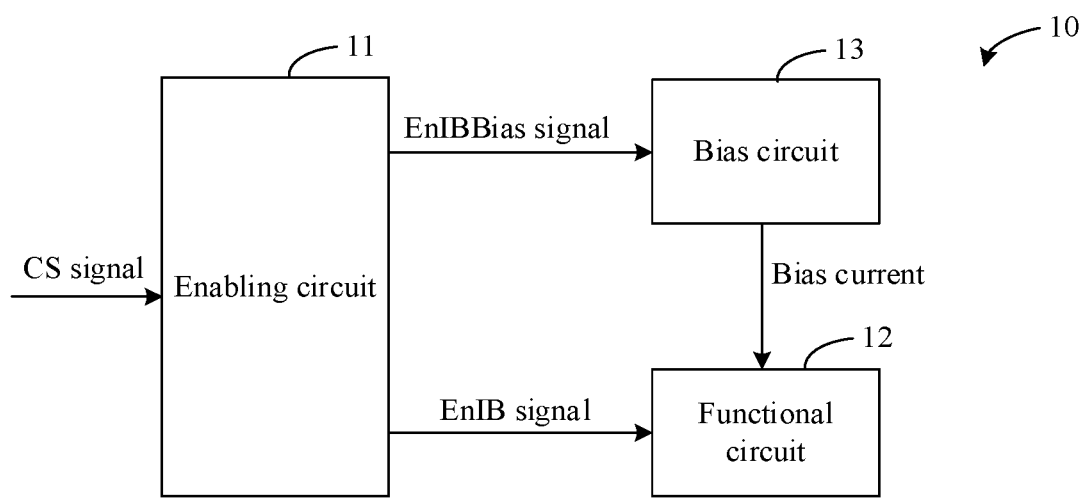
FIG. 1 is a schematic diagram of a composition structure of a control circuit.

Technical solutions in the embodiments of the disclosure are clearly and completely described below in combination with the drawings in the embodiments of the disclosure. It can be understood that the specific embodiments described herein are merely illustrative of the disclosure and are not intended to limit the disclosure. In addition, it is also to be noted that, for ease of description, only the parts related to the relevant disclosure are illustrated in the drawings.

Unless otherwise defined, all technological and scientific terms used in the disclosure have meanings the same as those usually understood by those skilled in the art of the disclosure. The terms used in the disclosure are only adopted to describe the embodiments of the disclosure and not intended to limit the disclosure.

"Some embodiments" involved in the following descriptions describes a subset of all possible embodiments. However, it can be understood that "some embodiments" may be the same subset or different subsets of all the possible embodiments, and may be combined without conflicts.

It is to be pointed out that terms "first/second/third" involved in the embodiments of the disclosure are only for distinguishing similar objects and do not represent a specific sequence of the objects. It can be understood that "first/second/third" may be interchanged to specific sequences or orders if allowed to implement the embodiments of the disclosure described herein in sequences except the illustrated or described ones.

It is also to be pointed out that the high level and low level used by a signal related to the embodiments of the present disclosure refer to logic level of the signal. A signal with a high level is different from same with a low level. For example, the high level may correspond to a signal with a first voltage, and the low level may correspond to a signal with a second voltage. In some embodiments, the first voltage is greater than the second voltage. In addition, the logic level of the signal may be different from or opposite to the described logic level. For example, a signal described as having a logic "high" level may alternatively have a logic "low" level, and a signal described as having a logic "low" level may alternatively have a logic "high" level.

For a semiconductor memory, referring to FIG. 1, FIG. 1 is a schematic diagram of a composition structure of a control circuit. As illustrated in FIG. 1, the control circuit 10 may include an enabling circuit 11, a functional circuit 12 and a bias circuit 13. Herein, the enabling circuit 11 is configured to receive a power switching signal and output a bias enabling signal and an excitation signal according to the power switching signal. The functional circuit 12 is connected with the enabling circuit 11 and configured to receive the excitation signal to start the functional circuit 12. The bias circuit 13 is connected with the enabling circuit 11 and configured to receive a bias enabling signal to start the bias circuit 13. In addition, the bias circuit 13 is also connected with the functional circuit 12 and configured to provide a bias current for the functional circuit 12.

In the embodiment of the present disclosure, the power switching signal may be represented by CS, the bias enabling signal may be represented by EnIBBias, and the excitation signal may be represented by EnIB. Herein, the CS signal is configured to characterize that the control circuit 10 is switched from a Power Down State to a Power On State, so as to start the functional circuit 12 and the bias circuit 13. The EnIB signal is an enabling signal provided for the functional circuit 12 to start the functional circuit 12, and the EnIBBias signal is an enabling signal provided for the bias circuit 13 to start the bias circuit 13.

Figure 2:
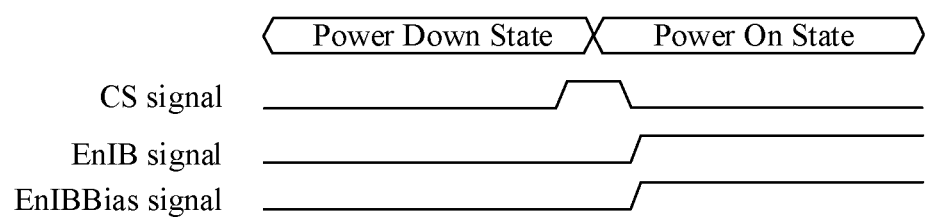
FIG. 2 is a schematic diagram of a signal timing sequence of a control circuit.

Based on the control circuit 10 illustrated in FIG. 1, FIG. 2 is a schematic diagram of a signal timing sequence of a control circuit 10. As illustrated in FIG. 2, the control circuit 10 may include a Power Down State and a Power on State. Herein, the CS signal is a pulse signal with a valid high-level. At a first changing edge of the CS signal (that is, when switching from a low-level state to a high-level state), the control circuit 10 is in a Power Down State, but starts to switch the state. At a second changing edge of the CS signal (that is, when switching from a high-level state to a low-level state), the control circuit 10 enters a Power On State. Meanwhile, at the second changing edge of the CS signal, the EnIB signal and the EnIBBias signal are also in an enabling state (that is, switching from a low-level state to a high-level state), which means that the functional circuit 12 and the bias circuit 13 are started.

That is, in the Power Down State, in order to save power, the functional circuit 12 and the bias circuit 13 are powered down. When exiting the Power Down State (that is, the second changing edge of the CS signal), it is necessary to start the functional circuit 12 and the bias circuit 13. However, compared with the functional circuit 12, the Recovery time of the bias circuit 13 is longer, which not only takes up the tXP time, but also may cause waste of power consumption due to longer Recovery time. Herein, the tXP time represents the time of Exit Power Down to Next One Command Delay.

Based thereon, the embodiments of the disclosure provide a control circuit. The first bias circuit and the second bias circuit are arranged, and the first bias circuit which provides a smaller bias current is in a normally open state, so that the control circuit can not only ensure the settle time of the bias circuit, avoid the problem that the tXP time is occupied due to long recovery time of the bias circuit, but also achieve the purpose of saving power.

Various embodiments of the present disclosure will now be described in detail in combination with the accompanying drawings.

Figure 3:
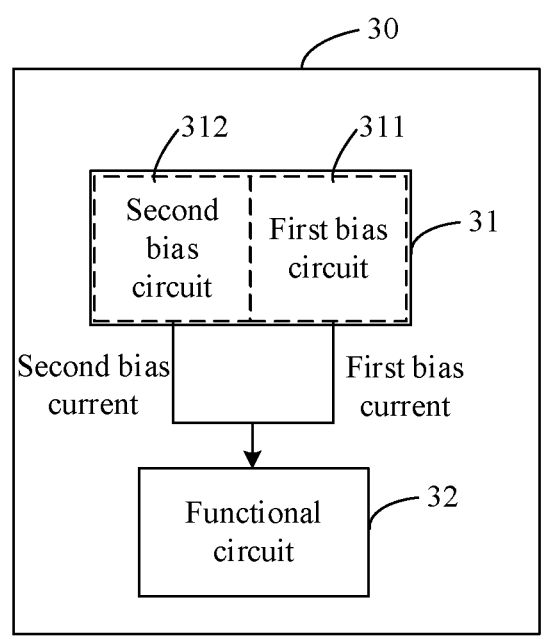
FIG. 3 is a first schematic diagram of a composition structure of a control circuit according to an embodiment of the present disclosure.

In an embodiment of the disclosure, referring to FIG. 3, FIG. 3 is a schematic diagram of a composition structure of a control circuit according to an embodiment of the present disclosure. As illustrated in FIG. 3, the control circuit 30 may include a bias circuit 31, and the bias circuit 31 is configured to provide a bias current for the functional circuit 32.

The bias circuit 31 includes a first bias circuit 311 and a second bias circuit 312. The first bias circuit 311 is configured to provide a first bias current, and the second bias circuit 312 is configured to provide a second bias current. Herein, the first bias current is smaller than the second bias current, the first bias circuit 311 is configured to be in a normally open state after being powered on, and the second bias circuit 312 is configured to receive a bias enabling signal and provide the second bias current based on the bias enabling signal.

It is to be noted that, in the embodiment of the present disclosure, the control circuit 30 may be applied to multiple circuit scenarios, especially to a power-saving control circuit scenario of a DDR5 memory with Low Power (LP), but it does not constitute a relevant limitation.

It is also to be noted that, in the embodiment of the present disclosure, the first bias circuit 311 and the second bias circuit 312 are connected in parallel. Herein, the first bias circuit 311 may also be called a low power bias circuit. The bias circuit is in a normally open state. That is, the first bias circuit 311 will not be powered down in the case where the associated functional circuit does not work, or as long as a device (for example, a memory) contains the circuit, the device is in a Power On State. The second bias circuit 312 may also be called a Normal bias circuit, and the bias circuit will be powered down when the associated functional circuit is in a Power Down State and does not work. Thus, when the second bias circuit 312 is started by receiving the bias enabling signal, the Recovery time of the whole bias circuit may be reduced to save the settle time of the bias circuit. The settle time refers to the time required for the bias circuit to reach a target settle state. In some embodiments, the functional circuit 32 is configured to receive an excitation signal and to be started based on the excitation signal. Herein, the time point when the functional circuit 32 receives the excitation signal is later than the time point when the bias circuit receives the corresponding bias enabling signal. In the embodiment of the present disclosure, the functional circuit 12 may be an input buffer circuit, such as a Command Address (CA)/Clock (Clk) input buffer circuit.

In the embodiment of the present disclosure, the excitation signal may be represented by EnIB, and the bias enabling signal may be represented by EnIBBias. Herein, the bias enabling signal is configured to start the bias circuit 31 (specifically the second bias circuit 312), and the excitation signal is configured to start the functional circuit 32.

After exiting the Power Down State, the bias circuit 31 can be enabled to start only after a certain recovery time, and only when the enable starting of the bias circuit is consistent with the enable starting of the functional circuit, the power loss will not be caused. That is, it is best that the time point when the bias circuit 31 is recovered is consistent with the time point when the functional circuit is enabled to start. Therefore, in order not to waste power, the time point when the functional circuit receives the excitation signal needs to be later than the time point when the bias circuit receives the corresponding bias enabling signal, so as to reserve a certain recovery time for the bias circuit.

Figure 4:
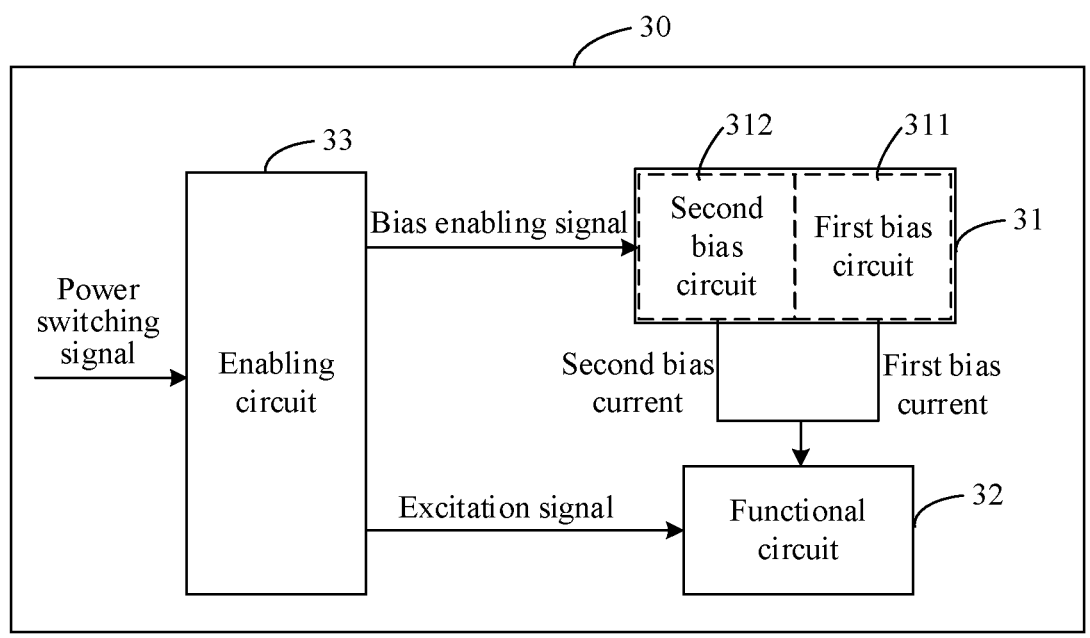
FIG. 4 is a second schematic diagram of a composition structure of a control circuit according to an embodiment of the present disclosure.

In some embodiments, based on the control circuit 30 illustrated in FIG. 3, referring to FIG. 4, the control circuit 30 may also include an enabling circuit 33.

The enabling circuit 33 is configured to receive a power switching signal and output a bias enabling signal and an excitation signal based on the power switching signal. Herein, the power switching signal characterizes starting the functional circuit.

In the embodiment of the present disclosure, the power switching signal may be represented by CS, and the CS signal is a pulse signal. In the definition of technical specifications, the pulse width is at least 3 nanoseconds. In addition, the CS signal is also configured to characterize that the control circuit 10 is switched from the Power Down State to the Power On State, so that the control circuit 10 can start the functional circuit 32 after being powered on.

Further, since the power switching signal is a pulse signal, in some embodiments, the power switching signal may include a preceding first changing edge and a subsequent second changing edge.

The enabling circuit 33 is further configured to output the bias enabling signal at the first changing edge, and configured to output the excitation signal at the second changing edge.

In the embodiment of the present disclosure, the time point when the bias enabling signal enters an enabling state needs to be earlier than the time point when the excitation signal enters the enabling state, so that the recovery time may be reserved for the bias circuit before the excitation signal is enabled. Exemplarily, the enabling circuit 33 may output the bias enabling signal at the first changing edge and output the excitation signal at the second changing edge, so that the settle time of the bias circuit is increased by the pulse time of the CS signal, and the tXP time may be avoided from being occupied.

In some embodiments, the changing direction of the first changing edge is opposite to the changing direction of the second changing edge. In other embodiments, the first changing edge and the second changing edge may be a rising edge and a falling edge, which are of different pulse signals transmitted successively.

In some embodiments, the first changing edge may be switched from a low level state to a high level state, and the second changing edge may be switched from a high level state to a low level state.

It is to be noted that, if the CS signal is a valid low-level pulse signal, the first changing edge may be switched from a high-level state to a low-level state, and the second changing edge may be switched from a low-level state to a high-level state. Alternatively, if the CS signal is a valid high-level pulse signal, the first changing edge may be switched from a low-level state to a high-level state, and the second changing edge may be switched from a high-level state to a low-level state, which is not limited in the embodiment of the present disclosure.

Figure 5:
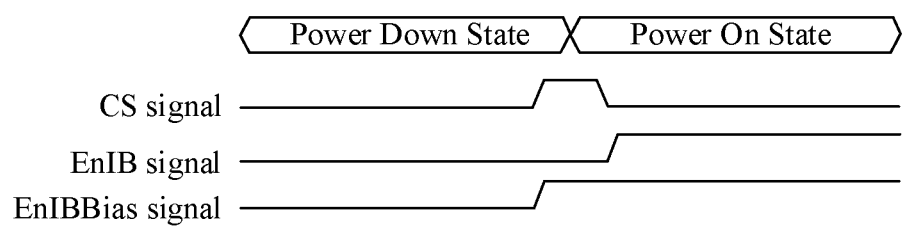
FIG. 5 is a schematic diagram of a signal timing sequence of a control circuit according to an embodiment of the present disclosure.

Exemplarily, FIG. 5 is a schematic diagram of a signal timing sequence according to an embodiment of the present disclosure. As illustrated in FIG. 5, the control circuit 30 may also include a Power Down State and a Power On State. Then, the EnIBBias signal is output at the first changing edge of the CS signal, and the EnIB signal is output at the second changing edge of the CS signal, so that the time point when EnIBBias is in the enabling state is earlier than the time point when the EnIB signal is in the enabling state.

It is to be noted that the first changing edge of the CS signal is in the period with the Power Down State, and the second changing edge of the CS signal is in the period with the Power On State. Although the first changing edge of the CS signal is in the period with the Power Down State, the second bias circuit 312 may be started at a switching point between the Power Down State and the Power On State since there is a signal delay, so that the final starting of the second bias circuit 312 is in the period with the Power On State. Since the functional circuit receives the enabling signal and enters the enabling state when being in the Power On State, the time point when the EnIB signal is provided for the functional circuit 32 is later than the time point when the EnIBBias signal is provided for the second bias circuit 312. That is, the recovery time is reserved for the bias circuit (specifically, the second bias circuit), which facilitates preventing the functional circuit 32 from incapability of working normally in the case of ensuring the settle time of the bias circuit, thus saving power.

In some embodiments, the enabling circuit 33 is further configured to receive a state signal, perform logical operation processing based on the power switching signal and the state signal, and output a bias enabling signal and an excitation signal. Herein, the state signal characterizes that the control circuit is in a Power Down State or a Power On State.

It is to be noted that the state signal may be represented by PowerDn. Herein, when the PowerDn signal is in a high level state, it characterizes that the control circuit 30 is in the Power Down State. When the PowerDn signal is in a low level state, it characterizes that the control circuit 30 is in the Power On State.

Figure 6:
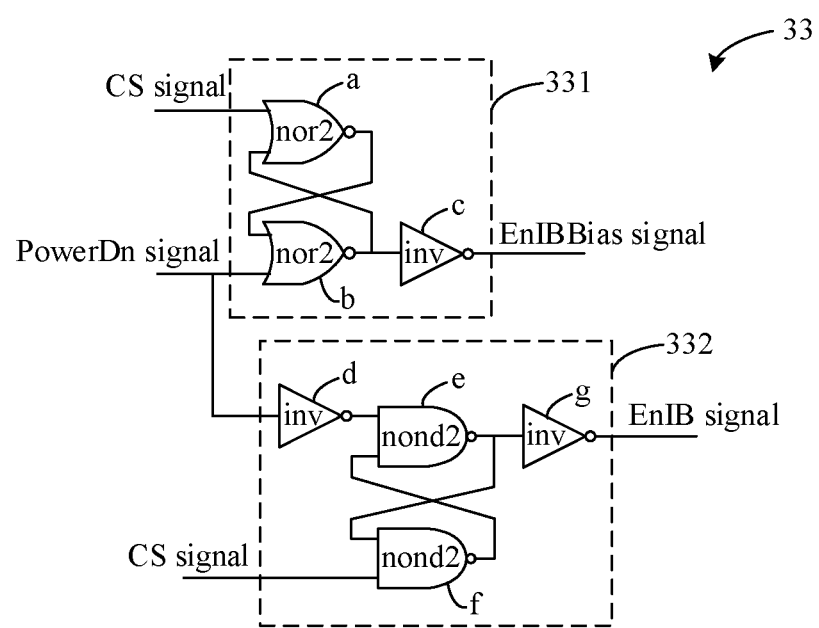
FIG. 6 is a third schematic diagram of a composition structure of a control circuit according to an embodiment of the present disclosure.

In some embodiments, for the enabling circuit 33, referring to FIG. 6, the enabling circuit 33 may include a first logic circuit 331 and a second logic circuit 332.

The first logic circuit 331 is configured to receive a power switching signal and a state signal, and perform first logic operation on the power switching signal and the state signal to output a bias enabling signal.

The second logic circuit 332 is configured to receive a power switching signal and a state signal, and perform second logic operation on the power switching signal and the state signal to output an excitation signal.

Here, the input of the first logic circuit 331 is the CS signal and PowerDn signal, and the output is the EnIBBias signal. The input of the second logic circuit 332 is the CS signal and PowerDn signal, and the output is the EnIB signal.

In some embodiments, for the first logic circuit 331, in FIG. 6, the first logic circuit 331 may include a first NOR gate a, a second NOR gate b and a first NOT gate c.

One input end of the first NOR gate a is configured to receive a power switching signal, and the other input end of the first NOR gate a is connected with an output end of the second NOR gate b. One input end of the second NOR gate b is connected with an output end of the first NOR gate a, and the other input end of the second NOR gate b is configured to receive a state signal, and the output end of the second NOR gate b is also connected with the input end of the first NOT gate c.

In the embodiment of the disclosure, an output end of the first NOT gate c is configured to output a bias enabling signal. Here, when the power switching signal is switched from a first level state to a second level state and the state signal is in the second level state, the bias enabling signal output by the first logic circuit 331 is in the second level state. Alternatively, when the power switching signal is switched from the second level state to the first level state and the state signal is in the first level state, the bias enabling signal output by the first logic circuit 331 is in the second level state.

In a specific embodiment, the first level state is a low level state, and the second level state is a high level state. Thus, when the CS signal is switched from the low level state to the high level state and the PowerDn signal is in the high level state, the EnIBBias signal at the time is switched from the low level state to the high level state. Alternatively, when the CS signal is switched from the high level state to the low level state, and the PowerDn signal is in the low level state, the EnIBBias signal at the time remains in the high level state. Herein, the EnIBBias signal is in the high level state, which means that the EnIBBias signal is in an enabling state. That is, at the rising edge moment of the CS signal (that is, switched from the low level state to the high-level state), the EnIBBias signal is in the enabling state.

In some embodiments, for the second logic circuit 332, in FIG. 6, the second logic circuit 332 may include a second NOT gate d, a first NAND gate e, a second NAND gate f and a third NOT gate g.

An input end of the second NOT gate d is configured to receive a state signal. An output end of the second NOT gate d is connected with one input end of the first NAND gate e, the other input end of the first NAND gate e is connected with an output end of the second NAND gate f, an output end of the first NAND gate e is connected with one input end of the second NAND gate f, the other input end of the second NAND gate f is configured to receive a power switching signal, and the output end of the first NAND gate e is also connected with an input end of the third NOT gate g.

In the embodiment of the disclosure, an output end of the first NOT gate g is configured to output an excitation signal. Here, when the power switching signal is switched from a first level state to a second level state and the state signal is in the second level state, the excitation signal output by the second logic circuit 332 is in the first level state. Alternatively, when the power switching signal is switched from the second level state to the first level state and the state signal is in the first level state, the excitation signal output by the second logic circuit 332 is in the second level state.

In a specific embodiment, the first level state is a low level state, and the second level state is a high level state. Thus, when the CS signal is switched from the low level state to the high level state and the PowerDn signal is in the high level state, the EnIB signal at the time remains in the low level state. Alternatively, when the CS signal is switched from the high level state to the low level state, and the PowerDn signal is in the low level state, the EnIB signal at the time is switched from the low level state to the high level state. Herein, the EnIB signal is in the high level state, which means that the EnIB signal is in an enabling state. That is, at the falling edge moment of the CS signal (that is, switched from the high level state to the low level state), the EnIB signal is in the enabling state. That is, the EnIB signal is in the enabling state later than the EnIBBias signal is in the enabling state.

Figure 7:
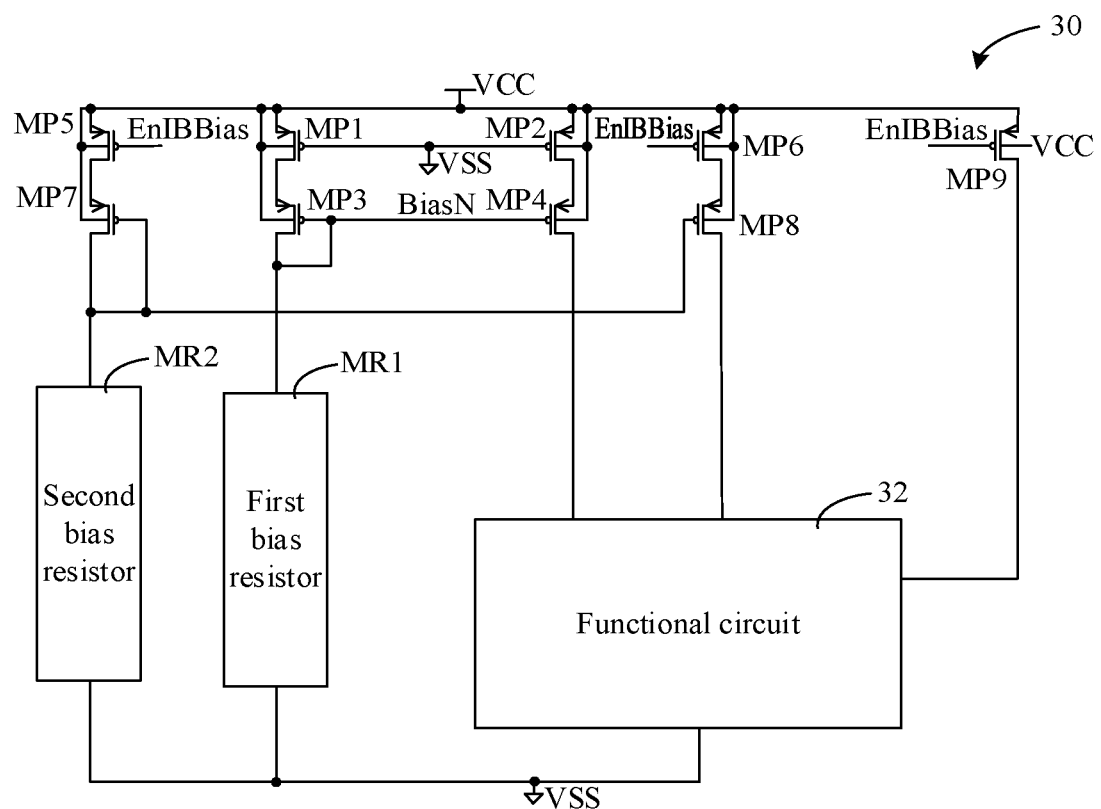
FIG. 7 is a first schematic diagram of a detailed structure of a control circuit according to an embodiment of the present disclosure.

It is to be understood that, for the first bias circuit 311 and the second bias circuit 312, FIG. 7 is a schematic diagram of a detailed structure of a control circuit 30 according to an embodiment of the present disclosure. As illustrated in FIG. 7, in the control circuit 30, the first bias circuit 311 is connected in parallel with the second bias circuit 312. Moreover, the first bias circuit 311 may include a first bias resistor MR1, and the second bias circuit 312 may include a second bias resistor MR2. Herein, a resistance value of the first bias resistor MR1 is greater than a resistance value of the second bias resistor MR2.

It is to be noted that, in the embodiment of the present disclosure, the first bias resistor MR1 may contain a plurality of sub-bias resistors, and the second bias resistor MR2 may also contain a plurality of sub-bias resistors. That is, the equivalent resistance value of the plurality of sub-bias resistors in the first bias resistor MR1 needs to be greater than the equivalent resistance value of the plurality of sub-bias resistors in the second bias resistor MR2.

It is also to be noted that, in the embodiment of the present disclosure, assuming that each sub-bias resistor has the same resistance value and different sub-bias resistors are connected in series, the number of the sub-bias resistors included in the first bias resistor MR1 is greater than the number of the sub-bias resistors included in the second bias resistor MR2.

Further, the first bias circuit 311 may include four transistors in addition to the first bias resistor. In some embodiments, as illustrated in FIG. 7, the first bias circuit 311 may further include a first transistor MP1, a second transistor MP2, a third transistor MP3 and a fourth transistor MP4.

A drain electrode of the first transistor MP1 and a drain electrode of the second transistor MP2 are both connected with a power supply terminal.

A gate electrode of the first transistor MP1 and a gate electrode of the second transistor MP2 are both connected with a ground terminal.

A source electrode of the first transistor MP1 is connected with a drain electrode of the third transistor MP3, and a source electrode of the second transistor MP2 is connected with a drain electrode of the fourth transistor MP4.

A gate electrode of the third transistor MP3 and a gate electrode of the fourth transistor MP4 are both connected with a source electrode of the third transistor MP3, and the source electrode of the third transistor MP3 is connected with the ground terminal through the first bias resistor MR1.

A source electrode of the fourth transistor MP4 is connected with a functional circuit 32, and is configured to provide a first bias current for the functional circuit 32.

Further, the second bias circuit 312 may also include four transistors in addition to the second bias resistor. In some embodiments, as illustrated in FIG. 7, in some embodiments, the second bias circuit 312 may further include a fifth transistor MP5, a sixth transistor MP6, a seventh transistor MP7 and an eighth transistor MP8.

A drain electrode of the fifth transistor MP5 and a drain electrode of the sixth transistor MP6 are both connected with a power supply terminal.

A gate electrode of the fifth transistor MP5 and a gate electrode of the sixth transistor MP6 are both connected with a bias enabling signal.

A source electrode of the fifth transistor MP5 is connected with a drain electrode of the seventh transistor MP7, and a source electrode of the sixth transistor MP6 is connected with a drain electrode of the eighth transistor MP8.

A gate electrode of the seventh transistor MP7 and a gate electrode of the eighth transistor MP8 are both connected with a source electrode of the seventh transistor MP7, and the source electrode of the seventh transistor MP7 is connected with a ground terminal through the second bias resistor MR2.

A source electrode of the eighth transistor MP8 is connected with a functional circuit 32, and is configured to provide a second bias current for the functional circuit 32.

It is to be noted that in the embodiment of the present disclosure, the first transistor MP1, the second transistor MP2, the third transistor MP3, the fourth transistor MP4, the fifth transistor MP5, the sixth transistor MP6, the seventh transistor MP7, and the eighth transistor MP8 are all PMOS transistors.

In addition, in FIG. 7, the power supply terminal is represented by VCC, and the ground terminal is represented by VSS. Here, the input signals of the gate electrode of the first transistor MP1 and the gate electrode of the second transistor MP2 are VSS signals, so that the two transistors are in a normally open state, while the input signals of the gate electrode of the third transistor MP3 and the gate electrode of the fourth transistor MP4 are represented by BiasN, and the BiasN signal is generated by connecting the first bias resistor MR1 to the ground terminal, and is configured to control the conduction states of the third transistor MP3 and the fourth transistor MP4, so as to provide the first bias current for the functional circuit 32. In addition, the input signals of the gate electrode of the fifth transistor MP5 and the gate electrode of the sixth transistor MP6 are EnIBBias signals, so as to control the conduction states of the fifth transistor MP5 and the sixth transistor MP6 according to the EnIBBias signals, while the input signals of the gate electrode of the seventh transistor MP7 and the gate electrode of the eighth transistor MP8 are generated by connecting the second bias resistor MR2 to the ground terminal, and are configured to control the conduction states of the seventh transistor MP7 and the eighth transistor MP8, so as to provide the second bias current for the functional circuit 32.

It is also to be noted that, in the embodiment of the present disclosure, as illustrated in FIG. 7, the second bias circuit 311 may also include a ninth transistor MP9. Herein, the drain electrode of the ninth transistor MP9 is connected with the power supply terminal, the gate electrode of the ninth transistor MP9 is connected with the bias enabling signal, and the source electrode of the ninth transistor MP9 is connected with the functional circuit 32 and configured to supply power supply voltage to the functional circuit 32.

It is also to be understood that in the embodiment of the present disclosure, for the functional circuit 32, the functional circuit 32 may include an input buffer circuit. Thus, in a specific embodiment, when the control circuit 30 is in the Power On State, the input buffer circuit may be provided with a first bias current through the first bias circuit 311, the input buffer circuit may be provided with a second bias current through the second bias circuit 312, and the first bias current is smaller than the second bias current.

The embodiment provides a control circuit. The control circuit includes a bias circuit. The bias circuit is configured to provide a bias current for a functional circuit. The bias circuit includes a first bias circuit and a second bias circuit. The first bias circuit is configured to provide a first bias current, and the second bias circuit is configured to provide a second bias current. Herein, the first bias current is smaller than the second bias current, the first bias circuit is configured to be in a normally open state after being powered on, and the second bias circuit is configured to receive a bias enabling signal and provide the second bias current based on the bias enabling signal. Thus, the first bias circuit and the second bias circuit are arranged, and the first bias circuit which provides a smaller bias current is in a normally open state, so that the control circuit can not only ensure the settle time of the bias circuit, avoid the problem that the tXP time is occupied due to long recovery time of the bias circuit, but also achieve the purpose of saving power.

Figure 8:
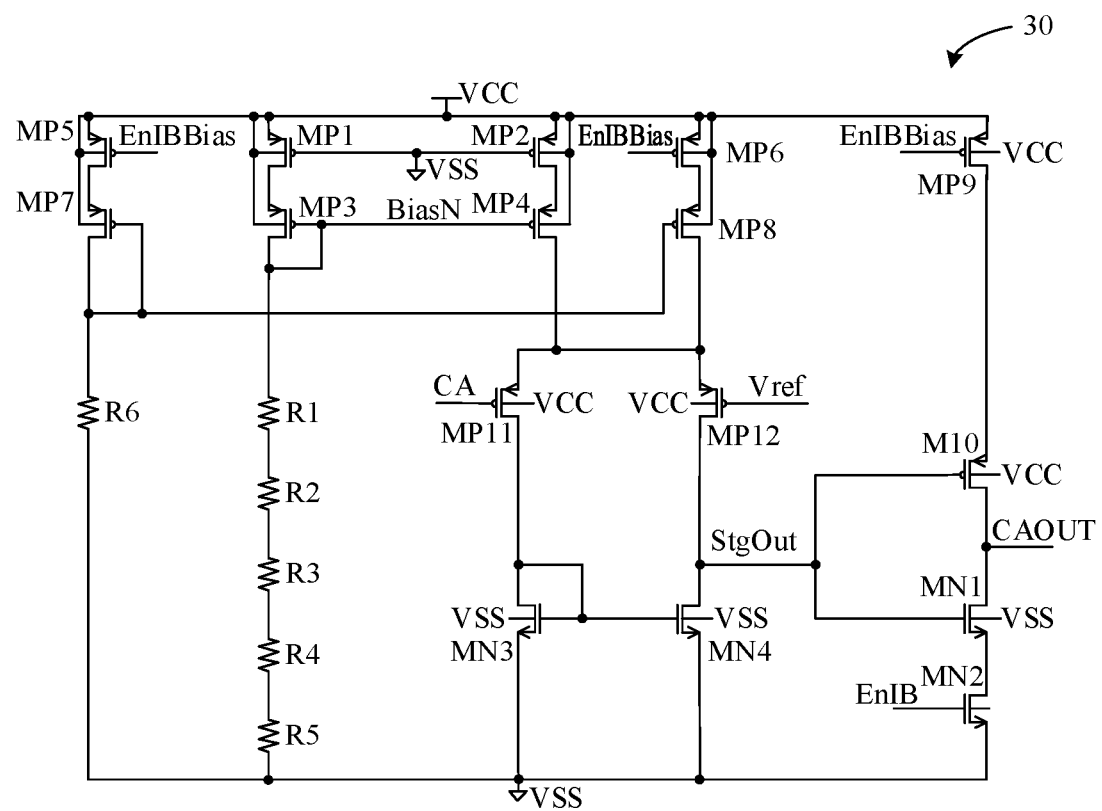
FIG. 8 is a second schematic diagram of a detailed structure of a control circuit according to an embodiment of the present disclosure.

In another embodiment of the disclosure, FIG. 8 is a schematic diagram of a detailed structure of another control circuit 30 according to an embodiment of the present disclosure. As illustrated in FIG. 8, the control circuit 30 may include a first resistor R1, a second resistor R2, a third resistor R3, a fourth resistor R4, a fifth resistor R5, a sixth resistor R6, a first transistor MP1, a second transistor MP2, a third transistor MP3, a fourth transistor MP4, a fifth transistor MP5, a sixth transistor MP6, a seventh transistor MP7, an eighth transistor MP8, a ninth transistor MP9, a tenth transistor MP10, an eleventh transistor MN1, a twelfth transistor MN2, a thirteenth transistor MP11, a fourteenth transistor MP12, a fifteenth transistor MN3 and a sixteenth transistor MN4.

Herein, the first transistor MP1, the second transistor MP2, the third transistor MP3, the fourth transistor MP4, the fifth transistor MP5, the sixth transistor MP6, the seventh transistor MP7, the eighth transistor MP8, the ninth transistor MP9, the tenth transistor MP10, the thirteenth transistor MP11, and the fourteenth transistor MP12 are PMOS transistors, and the eleventh transistor MN1, the twelfth transistor MN2, the fifteenth transistor MN3 and the sixteenth transistor MN4 are NMOS transistors.

It is to be noted that in FIG. 8, the first resistor R1, the second resistor R2, the third resistor R3, the fourth resistor R4 and the fifth resistor R5 with the first transistor MP1, the second transistor MP2, the third transistor MP3, and the fourth transistor MP4 form a first bias circuit, and the sixth resistor R6 with the fifth transistor MP5, the sixth transistor MP6, the seventh transistor MP7, and the eighth transistor MP8 forms a second bias circuit. In the first bias circuit, the first resistor R1, the second resistor R2, the third resistor R3, the fourth resistor R4 and the fifth resistor R5 are connected in series to form a first bias resistor. In the second bias circuit, the sixth resistor R6 forms a second bias resistor.

It is also to be noted that, in FIG. 8, the functional circuit takes the input buffer circuit as an example. The tenth transistor MP10, the eleventh transistor MN1, the twelfth transistor MN2, the thirteenth transistor MP11, the fourteenth transistor MP12, the fifteenth transistor MN3, and the sixteenth transistor MN4 constitute the input buffer circuit. In the input buffer circuit, the drain electrode of the thirteenth transistor MP11 is connected with the source electrode of the fourth transistor MP4 for receiving the first bias current. The drain electrode of the fourteenth transistor MP12 is connected with the source electrode of the eighth transistor MP8 for receiving the second bias current. The gate electrode of the thirteenth transistor MP11 is configured to receive a Command Address signal (represented by CA). The gate electrode of the fourteenth transistor MP12 is configured to receive a reference signal (represented by Vref). The source electrode of the thirteenth transistor MP11 is connected with the drain electrode of the fifteenth transistor MN3, and also connected with the gate electrode of the fifteenth transistor MN3 and the gate electrode of the sixteenth transistor MN4. The source electrode of the fourteenth transistor MP12 is connected with the drain electrode of the sixteenth transistor MN4 for outputting a Stage Output signal (represented by StgOut). The source electrode of the fifteenth transistor MN3 and the source electrode of the sixteenth transistor MN4 are both connected with the ground terminal. In addition, the drain electrode of the tenth transistor MP10 is connected with the source electrode of the ninth transistor MP9 for receiving power supply voltage. The gate electrode of the tenth transistor MP10 and the gate electrode of the eleventh transistor MN1 are both connected with the source electrode of the fourteenth transistor MP12, for receiving the StgOut signal. The source electrode of the tenth transistor MP10 is connected with the drain electrode of the eleventh transistor MN1 for outputting a Command Address Output signal (represented by CAOUT). The source electrode of the eleventh transistor MN1 is connected with the drain electrode of the twelfth transistor MN2, the gate electrode of the twelfth transistor MN2 is configured to receive an excitation signal (represented by EnIB), and the source electrode of the twelfth transistor MN2 is connected with the ground terminal.

In a specific embodiment, when implementing a power-saving control circuit of LP DDR5, the following operations may be used.

(1) The first bias circuit is connected in parallel with the second bias circuit. Moreover, one of the first bias circuit and the second bias circuit is a low-power bias circuit, which will never be powered down. The other one is a normal bias circuit, which will be powered down when being in the Power Down State. Thus, by arranging the first bias circuit and the second bias circuit, the settle time of the bias circuit may be saved.

(2) The technical solution of the embodiment of the present disclosure is to enable the bias circuit at the rising edge of the CS signal and enable the functional circuit (for example, the input buffer circuit) at the falling edge of the CS signal, so that a pulse time of a CS signal (in the definition of technical specifications, the pulse time is at least 3 nanoseconds) may be added to the settle time of the bias circuit, thereby further saving power while ensuring the settle time of the bias circuit.

Based thereon, the embodiment of the disclosure provides a control circuit. Through this embodiment, the specific implementation of the previous embodiment is described in detail. It is to be seen that the first bias circuit and the second bias circuit are arranged, and the first bias circuit that provides a smaller bias current is in a normally open state. Meanwhile, based on the timing sequence control of the enabling signals of the input buffer circuit and the bias circuit, the control circuit can not only ensure the settle time of the bias circuit, but also achieve the purpose of saving power.

Figure 9:
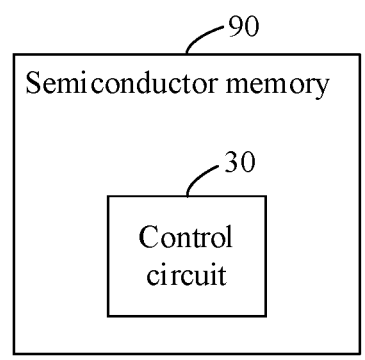
FIG. 9 is a schematic diagram of a composition structure of a semiconductor memory according to an embodiment of the present disclosure.

In yet another embodiment of the disclosure, referring to FIG. 9, FIG. 9 is a schematic diagram of a composition structure of a semiconductor memory 90 according to an embodiment of the present disclosure. As illustrated in FIG. 9, the semiconductor memory 90 may include the control circuit 30 of any of the previous embodiments.

In some embodiments of the disclosure, the semiconductor memory 90 is a DRAM chip.

Further, in some embodiments, the DRAM chip conforms to the DDR5 memory specification.

It is to be noted that the embodiment of the present disclosure relates to semiconductor integrated circuit design, in particular to an analog circuit. Specifically, a power-saving control circuit design that can implement LP DDR5 is mainly provided here.

It is also to be noted that, in the embodiment of the present disclosure, for the semiconductor memory 90, the first bias circuit and the second bias circuit are arranged in the control circuit, and the first bias circuit that provides a smaller bias current is in a normally open state. Meanwhile, based on timing sequence control of enabling signals of the input buffer circuit and the bias circuit, the control circuit can not only ensure the settle time of the bias circuit, avoid the problem that the tXP time is occupied due to long recovery time of the bias circuit, but also achieve the purpose of saving power.

The foregoing descriptions are only preferred embodiments of the disclosure and are not intended to limit the scope of protection of the disclosure.

It is to be noted that terms "include" and "contain" or any other variant thereof is intended to cover nonexclusive inclusions herein, so that a process, method, object or device including a series of elements not only includes those elements but also includes other elements which are not clearly listed or further includes elements intrinsic to the process, the method, the object or the device. Without further restrictions, the element defined by the statement "including a . . . " does not exclude the existence of another same element in the process, method, article or device including the element.

The sequence numbers of the embodiments of the disclosure are adopted not to represent superiority-inferiority of the embodiments but only for description.

The methods disclosed in several method embodiments provided in the present disclosure may be arbitrarily combined without conflict to obtain a new method embodiment.

The features disclosed in a plurality of product embodiments provided in the present disclosure may be arbitrarily combined without conflict to obtain a new product embodiment.

The features disclosed in the several method or device embodiments provided in the present disclosure may be arbitrarily combined without conflict to obtain a new method embodiment or device embodiment.

The above is only the specific implementation mode of the present disclosure and not intended to limit the scope of protection of the present disclosure. Any variations or replacements apparent to those skilled in the art within the technical scope disclosed by the present disclosure shall fall within the scope of protection of the present disclosure. Therefore, the scope of protection of the present disclosure shall be subject to the scope of protection of the claims.

The embodiments of the present disclosure provide a control circuit and a semiconductor memory. The control circuit includes a bias circuit. The bias circuit is configured to provide a bias current for a functional circuit. The bias circuit includes a first bias circuit and a second bias circuit. The first bias circuit is configured to provide a first bias current, and the second bias circuit is configured to provide a second bias current. Herein, the first bias current is smaller than the second bias current, the first bias circuit is configured to be in a normally open state after being powered on, and the second bias circuit is configured to receive a bias enabling signal and provide the second bias current based on the bias enabling signal. Thus, the first bias circuit and the second bias circuit are arranged, and the first bias circuit which provides a smaller bias current is in a normally open state, so that the control circuit can not only ensure the settle time of the bias circuit, avoid the problem that the tXP time is occupied due to long recovery time of the bias circuit, but also achieve the purpose of saving power.

What is claimed is:

1. A control circuit, comprising a bias circuit, the bias circuit being configured to provide a bias current for a functional circuit,
   the bias circuit comprising a first bias circuit and a second bias circuit, the first bias circuit being configured to provide a first bias current, and the second bias circuit being configured to provide a second bias current, wherein the first bias current is smaller than the second bias current, the first bias circuit is configured to be in a normally open state after being powered on, and the second bias circuit is configured to receive a bias enabling signal and provide the second bias current based on the bias enabling signal;
   wherein the functional circuit is configured to receive an excitation signal and to be started based on the excitation signal, wherein a time point when the functional circuit receives the excitation signal is later than a time point when the bias circuit receives the bias enabling signal; and
   wherein the control circuit further comprising an enabling circuit, wherein the enabling circuit is configured to receive a power switching signal and output the bias enabling signal and the excitation signal based on the power switching signal, wherein the power switching signal characterizes starting the functional circuit.

2. The control circuit of claim 1, wherein the power switching signal comprises a preceding first changing edge and a subsequent second changing edge, and the enabling circuit is further configured to output the bias enabling signal at the first changing edge, and configured to output the excitation signal at the second changing edge.

3. The control circuit of claim 2, wherein a changing direction of the first changing edge is opposite to a changing direction of the second changing edge.

4. The control circuit of claim 2, wherein the first changing edge is switched from a low level state to a high level state, and the second changing edge is switched from a high level state to a low level state.

5. The control circuit of claim 1, wherein the enabling circuit is further configured to receive a state signal, perform logical operation processing based on the power switching signal and the state signal, and output the bias enabling signal and the excitation signal, wherein the state signal characterizes that the control circuit is in a Power Down State or a Power On State.

6. The control circuit of claim 5, wherein the enabling circuit comprises a first logic circuit and a second logic circuit, wherein the first logic circuit is configured to receive the power switching signal and the state signal, and perform first logic operation on the power switching signal and the state signal to output the bias enabling signal, and the second logic circuit being configured to receive the power switching signal and the state signal, and perform second logic operation on the power switching signal and the state signal to output the excitation signal.

7. The control circuit of claim 6, wherein the first logic circuit comprises a first NOR gate, a second NOR gate and a first NOT gate, wherein one input end of the first NOR gate is configured to receive the power switching signal, the other input end of the first NOR gate is connected with an output end of the second NOR gate, one input end of the second NOR gate is connected with an output end of the first NOR gate, the other input end of the second NOR gate is configured to receive the state signal, and the output end of the second NOR gate is also connected with an input end of the first NOT gate.

8. The control circuit of claim 6, wherein the second logic circuit comprises a second NOT gate, a first NAND gate, a second NAND gate and a third NOT gate, wherein an input end of the second NOT gate is configured to receive the state signal, an output end of the second NOT gate is connected with one input end of the first NAND gate, the other input end of the first NAND gate is connected with an output end of the second NAND gate, an output end of the first NAND gate is connected with one input end of the second NAND gate, the other input end of the second NAND gate is configured to receive the power switching signal, and the output end of the first NAND gate is also connected with an input end of the third NOT gate.

9. A control circuit, comprising a bias circuit, the bias circuit being configured to provide a bias current for a functional circuit, the bias circuit comprising a first bias circuit and a second bias circuit, the first bias circuit being configured to provide a first bias current, and the second bias circuit being configured to provide a second bias current, wherein the first bias current is smaller than the second bias current, the first bias circuit is configured to be in a normally open state after being powered on, and the second bias circuit is configured to receive a bias enabling signal and provide the second bias current based on the bias enabling signal;

wherein the functional circuit comprises an input buffer circuit.

10. The control circuit of claim 9, wherein the first bias circuit is connected in parallel with the second bias circuit, the first bias circuit comprises a first bias resistor, and the second bias circuit comprises a second bias resistor, wherein a resistance value of the first bias resistor is greater than a resistance value of the second bias resistor.

11. The control circuit of claim 10, wherein the first bias circuit further comprises a first transistor, a second transistor, a third transistor and a fourth transistor, wherein a drain electrode of the first transistor and a drain electrode of the second transistor are both connected with a power supply terminal, a gate electrode of the first transistor and a gate electrode of the second transistor are both connected with a ground terminal, a source electrode of the first transistor is connected with a drain electrode of the third transistor, a source electrode of the second transistor is connected with a drain electrode of the fourth transistor, a gate electrode of the third transistor and a gate electrode of the fourth transistor are both connected with a source electrode of the third transistor, the source electrode of the third transistor is connected with the ground terminal through the first bias resistor, and a source electrode of the fourth transistor is connected with the functional circuit, and configured to provide the first bias current for the functional circuit.

12. The control circuit of claim 10, wherein the second bias circuit further comprises a fifth transistor, a sixth transistor, a seventh transistor and an eighth transistor, wherein a drain electrode of the fifth transistor and a drain electrode of the sixth transistor are both connected with a power supply terminal, a gate electrode of the fifth transistor and a gate electrode of the sixth transistor are both connected with the bias enabling signal, a source electrode of the fifth transistor is connected with a drain electrode of the seventh transistor, a source electrode of the sixth transistor is connected with a drain electrode of the eighth transistor, a gate electrode of the seventh transistor and a gate electrode of the eighth transistor are both connected with a source electrode of the seventh transistor, the source electrode of the seventh transistor is connected with the ground terminal through the second bias resistor, and a source electrode of the eighth transistor is connected with the functional circuit, and configured to provide the second bias current for the functional circuit.

13. A semiconductor memory, comprising a control circuit, the control circuit comprising a bias circuit, the bias circuit being configured to provide a bias current for a functional circuit, the bias circuit comprising a first bias circuit and a second bias circuit, the first bias circuit being configured to provide a first bias current, and the second bias circuit being configured to provide a second bias current, wherein the first bias current is smaller than the second bias current, the first bias circuit is configured to be in a normally open state after being powered on, and the second bias circuit is configured to receive a bias enabling signal and provide the second bias current based on the bias enabling signal;

wherein the functional circuit is configured to receive an excitation signal and to be started based on the excitation signal, wherein a time point when the functional circuit receives the excitation signal is later than a time point when the bias circuit receives the bias enabling signal.

14. The control circuit of claim 13, further comprising an enabling circuit, wherein the enabling circuit is configured to receive a power switching signal and output the bias enabling signal and the excitation signal based on the power switching signal, wherein the power switching signal characterizes starting the functional circuit.

15. The control circuit of claim 14, wherein the power switching signal comprises a preceding first changing edge and a subsequent second changing edge, and the enabling circuit is further configured to output the bias enabling signal at the first changing edge, and configured to output the excitation signal at the second changing edge.

16. The control circuit of claim 15, wherein a changing direction of the first changing edge is opposite to a changing direction of the second changing edge.

17. The control circuit of claim 15, wherein the first changing edge is switched from a low level state to a high level state, and the second changing edge is switched from a high level state to a low level state.

* * * * *